US009876263B2

(12) United States Patent
Ergin et al.

(10) Patent No.: US 9,876,263 B2
(45) Date of Patent: Jan. 23, 2018

(54) ARRANGEMENT AND METHOD FOR THE GALVANICALLY SEPARATED ENERGY TRANSMISSION

(71) Applicant: SIEMENS AKTIENGESELLSCHAFT, München (DE)

(72) Inventors: Dominik Ergin, Baiersdorf (DE); Dennie Lange, Erlangen (DE); Sebastian Martius, Forchheim (DE); Benjamin Sewiolo, Obermichelbach (DE); Andreas Ziroff, München (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 15/509,332

(22) PCT Filed: Aug. 31, 2015

(86) PCT No.: PCT/EP2015/069841
§ 371 (c)(1),
(2) Date: Jul. 14, 2017

(87) PCT Pub. No.: WO2016/037881
PCT Pub. Date: Mar. 17, 2016

(65) Prior Publication Data

US 2017/0324134 A1 Nov. 9, 2017

(30) Foreign Application Priority Data

Sep. 8, 2014 (DE) ........................ 10 2014 217 932

(51) Int. Cl.
*H03K 3/00* (2006.01)
*H01P 3/16* (2006.01)
*H01P 5/12* (2006.01)

(52) U.S. Cl.
CPC . *H01P 3/16* (2013.01); *H01P 5/12* (2013.01)

(58) Field of Classification Search
CPC .................................... H01P 3/16; H01P 5/12
See application file for complete search history.

(56) References Cited

U.S. PATENT DOCUMENTS 3,746,424 A 7/1973 Hermstein
4,742,197 A 5/1988 Mauthe
5,399,977 A * 3/1995 Yoshizako ............... H01P 5/04
324/642

(Continued)

FOREIGN PATENT DOCUMENTS

DE 69419480 T2 4/2000
DE 102004018207 A1 11/2005

(Continued)

OTHER PUBLICATIONS

German Search Report for related German Application No. 10 2014 217 932.7 dated Jul. 8, 2015, with English Translation.

(Continued)

*Primary Examiner* — Daniel Cavallari
(74) *Attorney, Agent, or Firm* — Lempia Summerfield Katz LLC

(57) ABSTRACT

The invention relates to an arrangement and a method for the galvanically separated energy transmission, in which the energy is transmitted via a dielectric waveguide.

9 Claims, 2 Drawing Sheets

(56) References Cited

U.S. PATENT DOCUMENTS

| | | | |
|---|---|---|---|
| 5,525,782 | A | 6/1996 | Yoneno et al. |
| 6,437,663 | B1 | 8/2002 | Kii et al. |
| 7,109,823 | B1 | 9/2006 | Schaffner |
| 7,750,753 | B1 | 7/2010 | Cadotte, Jr. et al. |
| 2012/0133306 | A1 | 5/2012 | Seliger et al. |

FOREIGN PATENT DOCUMENTS

| | | | |
|---|---|---|---|
| DE | 102007006827 | B3 | 3/2008 |
| GB | 736365 | A | 9/1955 |
| GB | 2185860 | A | 7/1987 |

OTHER PUBLICATIONS

International Preliminary Examination Report for PCT/EP2015/069841 dated Jan. 25, 2017, with English Translation.

PCT International Search Report of the International Searching Authority dated Dec. 7, 2015 for corresponding PCT/EP2015/069841, with English Translation.

PCT Written Opinion of the International Searching Authority dated Dec. 5, 2016, for corresponding PCT/EP2015/069841, with English Translation.

* cited by examiner

ARRANGEMENT AND METHOD FOR THE GALVANICALLY SEPARATED ENERGY TRANSMISSION

CROSS-REFERENCE TO RELATED APPLICATIONS

This application is the National Stage of International Application No. PCT/EP2015/069841, filed Aug. 31, 2015, that claims the benefit of German Patent Application No. DE 102014217932.7, filed Sep. 8, 2014. The entire contents of these documents are hereby incorporated herein by reference.

BACKGROUND

The present embodiments relate to an arrangement for galvanically separated energy transmission and to a method for galvanically separated energy transmission.

It is generally known that components in power engineering systems are controlled and supplied with energy. For control and supplying energy, system components are isolated from a high-voltage potential, hence there is a need for a galvanically separated design.

For example, the power system engineering components may be switching elements, electronic modules or measuring points that are isolated from ground potential. Energy transmission is predominantly executed wirelessly (e.g., by radio frequency identification (RFID) technology or optical fibers).

Power input is significantly lower than 1 watt (e.g., generally in the range of 100 mW), due to the fact that the diode-based rectifiers used for this purpose have limitations with respect to current and voltage spikes, and with respect of cooling. For this reason, it is only possible to the supply a consumer with a low power input.

SUMMARY AND DESCRIPTION

The scope of the present invention is defined solely by the appended claims and is not affected to any degree by the statements within this summary.

One or more of the present embodiments may obviate one or more of the drawbacks or limitations in the related art. For example, a method and an arrangement are provided that overcome the disadvantages of the aforementioned solutions.

An arrangement for galvanically separated energy transmission and a method for galvanically separated energy transmission are provided.

The arrangement for the galvanically separated energy transmission of voltages in the high-voltage range is configured such that energy is transmitted via a dielectric waveguide. Consequently, the power input (e.g., the power provided for the consumer) is significantly higher (e.g., up to 10 watts or more) than is possible in the prior art.

The use of the dielectric waveguide according to one or more of the present embodiments provides for the possibility to supply a plurality of consumers, such that power is distributed between the consumers. To this end, the dielectric waveguide may be configured such that the dielectric waveguide has a functional connection to at least a first rectifier device and at least a second rectifier device such that the first rectifier device (e.g., on the input side) has a conductive connection along the length of the dielectric waveguide to a first decoupling point located along the length of the waveguide, and the second rectifier device (e.g., on the input side) has a conductive connection to a second decoupling point located along the length of the waveguide, arranged with a clearance to the signal input of the waveguide and with a mutual clearance. A further degree of freedom is provided in that a decoupling of the power transmitted may be effected ahead of the end of the dielectric waveguide, and the second decoupling point, or any further decoupling point with a rectifier device, may be arranged at the end. With the various clearances, the distribution of power may be achieved, with the power routed to the respective consumer via the rectifier device.

If a power distribution of 1:n is to be achieved (e.g., where n is the number of consumers/decoupling points), the arrangement is configured such that the decoupling arrangement of the first decoupling point and/or the clearance of the first decoupling point to the signal input of the waveguide, and the decoupling arrangement of the second decoupling point and/or the clearance of the second decoupling point to the signal input of the waveguide, are mutually variable (e.g., such that the value of power tapped at the first and second decoupling points are equal).

In an embodiment, the functional connection may be configured in the form of holes or slots arranged within the clearance and configured for the decoupling of power and/or conductive structures fitted to the decoupling point. For example, the configurations are provided for varying the decoupling described.

In an embodiment, at least one electrically-insulating screening device is arranged on the dielectric waveguide, and the creepage path (e.g., the path described by electric currents that, in general, are caused by environmental influences and run on the surface of the dielectric waveguide) is extended, and losses are thereby minimized.

For example, in the interests of keeping the dimensions of the arrangement small, the insulating screening device may be configured such that the dielectric constant is smaller than the dielectric constant of the dielectric waveguide, and the insulating screening device is directly fitted to the waveguide. This low dielectric constant provides that the directly-fitted screening device does not affect the properties of the dielectric waveguide (e.g., at least not adversely).

Alternatively, in another embodiment, the insulating screening device is configured such that a space-forming clearance is provided between the dielectric waveguide and the screening device. A space-forming clearance is provided such that the dielectric constant of the screening device is greater than or equal to the dielectric constant of the dielectric waveguide.

Alternatively or additionally, in an embodiment, the space is filled (e.g., with a solid, liquid or gaseous insulating medium having a dielectric constant lower than the dielectric constant of the dielectric waveguide). As a space may be present, a corresponding filling may be provided. For example, this provides further degrees of freedom for the adjustment of optimum transmission performance.

In one or more embodiments, the waveguide is provided as at least one bar-type body of rectangular and/or cylindrical design. The rectangular and/or cylindrical design is well-researched and may be effectively modeled with respect to optimum function (e.g., with regard to transmission values).

For example, to perform data transmission (e.g., the transmission of timing information), in addition to the transmission of energy or the delivery of electrical power, an embodiment of the arrangement is configured such that a waveguide junction (e.g., configured as a coaxial cable or microstrip conductor) is functionally connected at one end of the dielectric waveguide.

To permit high-frequency transmission, and the deployment of the action provided (e.g., in the high-voltage range), the dielectric waveguide is formed of materials (e.g., aluminum oxide or Teflon) having a dielectric constant greater than 1. By using materials having a dielectric constant greater than 1, the efficiency of energy transmission is further increased (e.g., as radiation) and unwanted power losses are reduced.

In an embodiment, in a method for the galvanically separated energy transmission of voltages in the high-voltage range, the energy is transmitted via a dielectric waveguide. The method provides the advantages of the embodiments of the arrangement for galvanically separated energy transmission.

DETAILED DESCRIPTION

Figure 1:
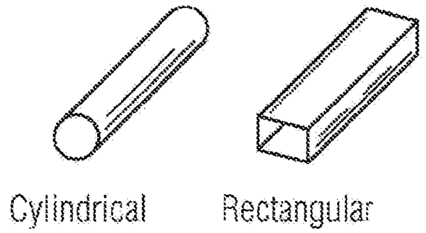
FIG. 1 shows exemplary embodiments of configurations of the dielectric waveguide.

FIG. 1 shows two exemplary configurations of the dielectric conductor. A first CYLINDRICAL variant embodiment and a second RECTANGULAR variant embodiment are both elongated bar-type solid bodies. The first CYLINDRICAL variant embodiment is of circular cross section and the second RECTANGULAR variant embodiment is of rectangular cross section. The solid CYLINDRICAL and RECTANGULAR bar-type bodies depicted may also be arranged sequentially to form a longer overall structure.

Figure 2:
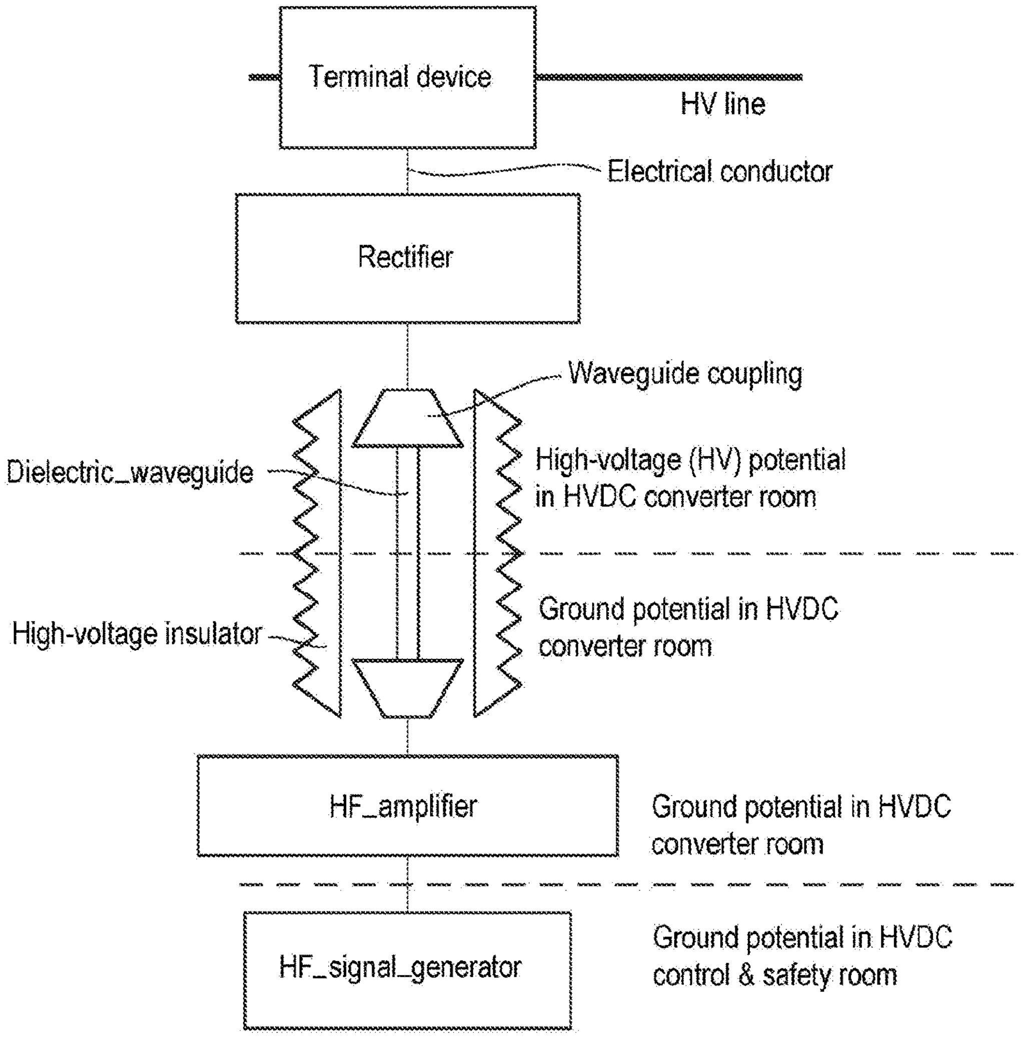
FIG. 2 shows a simplified circuit layout of an exemplary embodiment.

FIG. 2 shows a simplified circuit layout of an exemplary embodiment of the disclosed arrangement, which also represents an exemplary embodiment of the disclosed method.

An energy transmission arrangement in a high-voltage (HV) system is illustrated. From a high-frequency signal generator HF_SIGNAL_GENERATOR via a high-frequency amplifier HF_AMFLIFIER, and using a dielectric waveguide DIELECTRIC_WAVEGUIDE, the energy transmission arrangement effects the galvanic separation and transmission of energy to a rectifier device RECTIFIER (e.g., such that the energy transmitted through the waveguide undergoes rectification) so that the resulting rectified voltage (e.g., which may be tapped from the rectifier device and is thus present in the form of DC voltage) is available to a terminal device TERMINAL DEVICE connected on a high-voltage line (HV line).

In the interests of the maximum efficiency of electronic components, and in the light of regulatory conditions governing radiation behavior, the exemplary embodiment represented may be provided such that the frequencies of the high-frequency signal lie within the ISM band of 2.45 GHz to 5.8 GHz. For the purposes of efficient energy transmission, a material with a low tan $\delta$ is employed within a transmission frequency band of this type.

In the interests of the maximum compactness of the waveguide DIELECTRIC_WAVEGUIDE and the minimization of radiation, the selected dielectric constant $\in_r$ may be as high as possible. Exemplary materials used are aluminum oxide or Teflon. From the example shown, it is evident that, rather than a plurality of separate optical waveguides, a single waveguide may be employed for the transmission of energy. The dielectric waveguide DIELECTRIC_WAVEGUIDE represented in the exemplary embodiment provides that a single consumer TERMINAL DEVICE and/or a plurality of consumers may be supplied. Power may be decoupled ahead of the end of the conductor DIELECTRIC WAVEGUIDE and routed to a further consumer.

The exemplary arrangement provides for transmitting energy required for switching purposes and transmitting data (e.g., including time information), for which purpose the high-frequency electrical signals from the HF source HF_SIGNAL_GENERATOR may be employed.

The dielectric waveguide is provided for transmitting energy and data. High-frequency electromagnetic waves in the mm wavelength spectrum or microwave spectrum are conducted in a cylindrical or rectangular bar-type material (e.g., depicted in FIG. 1) of dielectric constant >1.

To permit the bar to use electromagnetic waves for the simultaneous transmission of both energy and a communication signal (e.g. the timing signal), the bar is connected via a waveguide junction WAVEGUIDE COUPLING (e.g., a coaxial cable, a microstrip conductor or similar devices for the delivery of this function) to the frequency generator (e.g., signal source) HF_SIGNAL_GENERATOR using an selected and adjustable output power of the frequency generator HF_SIGNAL_GENERATOR.

Figure 3:
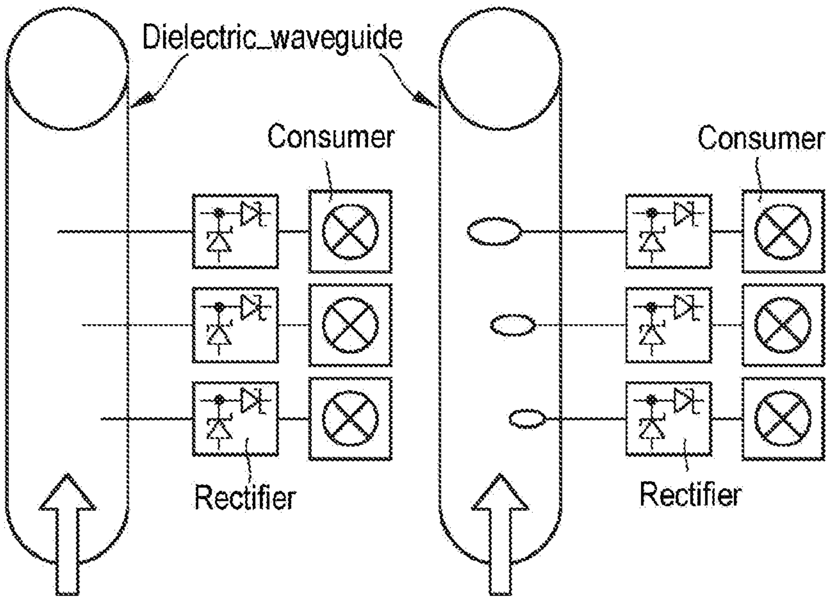
FIG. 3 shows exemplary embodiments of two variants of a decoupling arrangement.

FIG. 3 depicts an extract from FIG. 2, where the dielectric waveguide DIELECTRIC_WAVEGUIDE may not only technically utilize conduction properties between two end points of the dielectric waveguide, but may transmit in a ratio of 1:n using only a single conductor.

The signal is tapped from the waveguide via holes, as the dielectric waveguide DIELECTRIC_WAVEGUIDE has on the right-hand side of FIG. 3, or via slots, as the dielectric waveguide DIELECTRIC_WAVEGUIDE on the left-hand side of FIG. 3, and is routed to the respective consumer via a rectifier device RECTIFIER or, in the simplest case, decoupling may be effected entirely independently of structuring the material of the waveguide DIELECTRIC_WAVEGUIDE (e.g., in conjunction with metallic conductive structures).

The decoupling points for the field energy (e.g., positioned at various points on the dielectric waveguide DIELECTRIC_WAVEGUIDE and may be at different electrical potentials) and, as a result of the insulating properties of the dielectric waveguide DIELECTRIC_WAVEGUIDE, are mutually (DC) voltage-decoupled. In principle, the resulting potential differences may be very large, and may be achieved by structural measures, including under conditions of application.

As a result of a plurality of decoupling points along the waveguide DIELECTRIC_WAVEGUIDE, the energy transported in the waveguide DIELECTRIC_WAVEGUIDE declines in a manner corresponding to the decoupled power. To this end, the first decoupling point, considered from the wave infeed (e.g., marked in FIG. 3 with arrows), is configured with a lower rating than those that follow (e.g., represented by the smaller dimensions of the slot or the opening). For example, conditions are achieved whereby the power tapped at all the decoupling points has the same value (e.g., if desired). For example, from a total signal capacity of 3 watts (W), 1 W might be tapped from each decoupling point such that the relative dimensions thereof will need to be configured in a ratio of 1/3 for the first decoupling, 1/2 for the second decoupling and 1 for the third decoupling.

Figure 4:
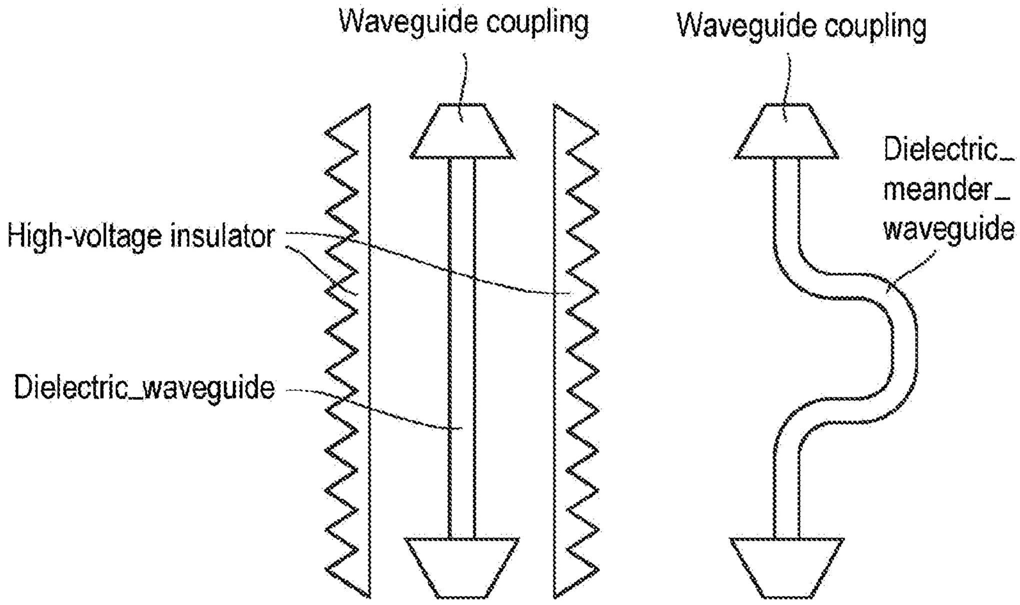
FIG. 4 shows an exemplary embodiment of two variants for extending the creepage path.

FIG. 4 represents embodiments whereby the creepage path between HV potential and ground potential (c.f. FIG. 2) is extended.

To this end, screening is fitted to the waveguide (e.g., the enclosure thereof in an insulator). This variant is represented on the left-hand side of FIG. 4. This screening HIGH-VOLTAGE_INSULATOR, if the $\in_r$ of the insulator HIGH-VOLTAGE INSULATOR is small in relation to that of the waveguide DIELECTRIC_WAVEGUIDE, such that the properties of the waveguide are not affected, may be fitted directly to the waveguide DIELECTRIC_WAVEGUIDE (e.g., not depicted in FIG. 4). The screening HIGH-VOLTAGE INSULATOR is arranged with a degree of clearance. As the tubular diameter is greater than the diameter of the waveguide DIELECTRIC_WAVEGUIDE, a solid, liquid or gaseous insulating medium may be inserted in the space generated by the clearance such that the properties of the waveguide DIELECTRIC_WAVEGUIDE (e.g., that conducts electromagnetic waves in the dielectric) are not compromised, but that the transmission is further optimized.

The meander structure of the dielectric waveguide DIELECTRIC_WAVEGUIDE depicted on the right-hand side of FIG. 4 extends the path of the creepage distance by the shaping the waveguide DIELECTRIC_WAVEGUIDE, and may therefore also be configured without an insulator HIGH-VOLTAGE INSULATOR.

The invention is not restricted by the exemplary embodiments represented, but rather includes all the forms of the embodiments encompassed by the claims. For example, in place of an optical fiber, a dielectric waveguide is employed for energy transmission in high-voltage systems (e.g., in the HV range). The dielectric waveguide may overcome one or more of the drawbacks or limitations in the related art. For example, one or more decoupling points are provided on the dielectric waveguide for the simultaneous tapping of information (e.g., timing signals) at various points, and for simultaneous tapping of equal or different power values at various potentials, are possible, and employment of the dielectric waveguide for information and/or power transmission in the HV range are achieved by a screening and/or a meander structure, and that microwave power in a rating of several watts may be generated with limited hardware costs (e.g., which likewise applies to the transmission of power using the dielectric conductor). Further, tolerance requirements for the assembly of corresponding components are relaxed, and a dielectric waveguide may be simply divided into individual rods of shorter length, with no requirement for stringent jointing tolerances, such that the waveguide is moreover cost-effective (e.g., if it is manufactured by plastic injection-molding or extrusion). If the waveguide is manufactured of a ceramic material (e.g., aluminum oxide), the waveguide may simultaneously be provided as a heat sink for switching components, and redundant designs may be achieved in a very simple manner. For example, on the source side, two or more n high-frequency sources are simultaneously active on the waveguide and/or, on the decoupling side two or more independent couplers are configured, that may tap all the requisite service power and the timing signal from the waveguide in a mutually independent manner.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A system for galvanically separated energy transmission of voltages in a high-voltage range, the system comprising:

a dielectric waveguide configured to transmit energy, wherein the dielectric waveguide has a functional connection to at least a first rectifier device and at least a second rectifier device, wherein the first rectifier device, on an input side of the first rectifier device, has a conductive connection along a length of the dielectric waveguide to a first decoupling point located along the length of the waveguide, and wherein the second rectifier device, on a input side of the second rectifier device, has a conductive connection to a second decoupling point located along the length of the waveguide, the at least first rectifier device and the at least second rectifier device arranged with a clearance to the signal input of the waveguide and with a mutual clearance, and wherein the functional connection is configured as holes or slots arranged within the clearance and are configured for the decoupling of power, conductive structures fitted to the decoupling point, or power and the conductive structures to the decoupling point, wherein the decoupling arrangement of the first decoupling point, the clearance of the first decoupling point to the signal input of the waveguide, or a combination thereof, and the decoupling arrangement of the second decoupling point, the clearance of the second decoupling point to the signal input of the waveguide, or a combination thereof, are mutually variable such that the value of power tapped at the first decoupling point and second decoupling point is equal.

2. The system of claim 1, wherein at least one electrically-insulating screening device is arranged on the dielectric waveguide.

3. The system of claim 1, wherein the insulating screening device is configured such that the dielectric constant of the screening device is smaller than the dielectric constant of the dielectric waveguide, and wherein the insulating screening device is directly fitted to the waveguide.

4. The system of claim 2, wherein the insulating screening device is configured such that a space-forming clearance is provided between the dielectric waveguide and the screening.

5. The system of claim 4, wherein the space is filled a solid, liquid or gaseous insulating medium having a dielectric constant lower than the dielectric constant of the dielectric waveguide.

6. The system of claim 2, wherein the waveguide is comprised of at least one bar-type body of rectangular, cylindrical, or rectangular and cylindrical design.

7. The system of claim 2, wherein a waveguide junction, configured as a coaxial cable or microstrip conductor, is functionally connected at one end of the dielectric waveguide.

8. The system of claim 2, wherein the dielectric waveguide comprises materials having a dielectric constant greater than 1.

9. The system of claim 8, wherein the materials comprise aluminum oxide or Teflon.

* * * * *